(12) United States Patent
Ararao

(10) Patent No.: US 8,691,607 B2
(45) Date of Patent: Apr. 8, 2014

(54) HERMETICALLY SEALED MEMS DEVICE AND METHOD OF FABRICATION

(71) Applicant: Texas Instruments Incorporated, Dallas, TX (US)

(72) Inventor: Virgil C. Ararao, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 13 days.

(21) Appl. No.: 13/671,734

(22) Filed: Nov. 8, 2012

(65) Prior Publication Data

US 2013/0330878 A1 Dec. 12, 2013

Related U.S. Application Data

(60) Provisional application No. 61/656,824, filed on Jun. 7, 2012, provisional application No. 61/706,369, filed on Sep. 27, 2012.

(51) Int. Cl.
*H01L 21/00* (2006.01)

(52) U.S. Cl.
USPC .............................. 438/48; 438/107; 438/110

(58) Field of Classification Search
None
See application file for complete search history.

(56) References Cited

U.S. PATENT DOCUMENTS

| 7,723,141 | B2* | 5/2010 | Robert | 438/48 |
| 7,876,029 | B2* | 1/2011 | Matsugi | 310/348 |
| 8,334,639 | B2* | 12/2012 | Saita | 310/344 |
| 2005/0101045 | A1* | 5/2005 | Shih et al. | 438/48 |
| 2007/0096312 | A1* | 5/2007 | Humpston et al. | 257/734 |
| 2008/0283943 | A1* | 11/2008 | Dekker et al. | 257/415 |
| 2011/0241181 | A1* | 10/2011 | Hayes et al. | 257/622 |

* cited by examiner

*Primary Examiner* — Scott B Geyer
(74) *Attorney, Agent, or Firm* — Warren L. Franz; Wade J. Brady, III; Frederick J. Telecky, Jr.

(57) ABSTRACT

A microelectromechanical (MEMS) device is fabricated from a wafer having a plurality of die regions with grooves and MEMS components formed on a wafer surface at each die region. A first metal having a relatively high melting temperature is formed on sidewalls of each groove, and a cap is attached at each die region to provide a closed cavity which encloses the grooves and MEMS components. Bottoms of the grooves are opened by thinning the wafer thereby establishing through-hole vias extending through the wafer at each die region, for accessing the cavity for inserting or removing material. The vias are sealed by interacting a second metal having a relatively low melting temperature with the first metal layer to form intermetallic compounds with higher melting temperature that maintain the seal during subsequent lower temperature operations.

32 Claims, 12 Drawing Sheets

FIG. 1B

GOLD-INDIUM

COPPER-INDIUM

GOLD-TIN

COPPER-TIN

HERMETICALLY SEALED MEMS DEVICE AND METHOD OF FABRICATION

This application claims the benefit of Provisional Application No. 61/656,824 filed Jun. 7, 2012 and of Provisional Application No. 61/706,369 filed Sep. 27, 2012, the entireties of both of which are incorporated herein by reference.

This relates to semiconductor devices and processes in general, and more specifically to the structure and fabrication of hermetically sealed microelectromechanical systems (MEMS) devices.

BACKGROUND

The wide variety of products collectively called microelectromechanical systems (MEMS) devices are typically small, lightweight devices on the micrometer to millimeter scale, which may have mechanically moving parts and often movable electrical power supplies and controls, or they may have parts sensitive to thermal, acoustic, or optical energy. MEMS devices have been developed to sense mechanical, thermal, chemical, radiant, magnetic, and biological quantities and inputs, and produce electrical signals as outputs. Because of their moving and sensitive nature, there is a need for physical and atmospheric protection of MEMS device parts. Consequently, MEMS devices are typically placed on or in a substrate and contained with a housing or package which is configured to shield the MEMS components against ambient and electrical disturbances, and against stress.

A microelectromechanical systems (MEMS) device integrates one or more mechanical elements, sensors, actuators, or the like together with associated electronics on a common substrate. The manufacturing approach for a MEMS device aims at using batch fabrication techniques similar to those used for other microelectronics devices. MEMS devices can thus benefit from mass production and minimized material consumption to lower the manufacturing cost, while trying to exploit well controlled integrated circuit technology.

Examples of MEMS devices include mechanical sensors, both pressure sensors including microphone membranes, and inertial sensors such as accelerometers coupled with the integrated electronic circuit of the chip. The mechanically moving parts of a MEMS device are fabricated together with the sensors and actuators in the process flow of the electronic integrated circuit (IC) on a semiconductor chip. The mechanically moving parts may be produced by an undercutting etch at some step during the IC fabrication. Examples of specific bulk micromachining processes employed in MEMS sensor production to create the movable elements and the cavities for their movements are anisotropic wet etching and deep reactive ion etching.

Another example is a digital infrared (IR) temperature sensor made in a silicon chip, which includes a thermopile (multiple thermocouple elements) of bismuth/antimony or constantan/copper pairs on a sensor membrane suspended in a cavity created by anisotropic silicon wet etching through a grid of holes. The cavity is closed by a laminate cover plate overlaying the membrane to protect the sensors, and the IR radiation reaches the thermocouple tips through the silicon bulk at the rear of the cavity.

While the fabrication of MEMS devices can benefit from wafer-level processes, the packaging for many such devices does not have to be fully hermetic, i.e., impermeable to water molecules. Consequently, such packaging may use sealants made of polymeric compounds. On the other hand, some MEMS devices require or at least greatly benefit from fuller hermetic sealing. Examples of such devices are deflectable or deformable micromirror devices, including torsion beam micromirror devices, cantilever beam micromirror devices, and flexure beam micromirror devices. Each movable mirror element of all three types of such beam devices includes a relatively thick metal reflector supported in a normal, undeflected position by an integral, relatively thin metal beam. In the normal position, the reflector is movably supported over a substrate and spaced from an underlying control electrode to which a voltage may be selectively applied by an addressing circuit. A suitable voltage applied to the electrode can electrostatically attract the reflector to move or deflect it from its normal position toward the control electrode and the substrate. Such movement or deflection causes deformation of the supporting beam which stores potential energy that mechanically biases the reflector for movement back to its normal position when the attracting voltage is removed. The deformation of a cantilever beam comprises bending about an axis normal to the beam's axis. The deformation of a torsion beam comprises deformation by twisting about an axis parallel to the beam's axis. The deformation of a flexure beam, which is a relatively long cantilever beam connected to the reflector by a relatively short torsion beam, comprises both types of deformation, permitting the reflector to move in piston-like fashion.

An example micromirror device is a DMD (digital micromirror device) spatial light modulator such as a DLP™ DMD device available from Texas Instruments. A typical DMD device includes an array of individually addressable light modulating pixel element micromirrors, the reflectors of each of which are selectively positioned to reflect or to not reflect light to a desired site. In order to avoid an accidental engagement of a reflector and its control electrode, a landing electrode may be added for each reflector. It has been found, though, that there is a risk that a deflected reflector may stick to or adhere to its associated landing electrode. It is postulated that such stiction (static friction that needs to be overcome to enable relative movement) effect may be caused by intermolecular attraction between the reflector and the landing electrode or by high surface energy substances adsorbed on the surface of the landing electrode and/or on the portion of the reflector which contacts the landing electrode. Substances which may impart such high surface energy to the reflector-landing electrode interface include water vapor or other ambient gases (e.g., carbon monoxide, carbon dioxide, oxygen, nitrogen) and gases and organic components resulting from or left behind following production of the device.

The problem of stiction has been addressed by applying selected numbers, durations, shapes and magnitudes of voltage pulses to the control electrode, and by passivating or lubricating the portion of the landing electrode engaged by the deformed reflector, and/or the portion of the deformed reflector which engages the landing electrode. Passivation is effected by lowering the surface energy of the landing electrode and/or the reflector through, for example, chemically vapor-depositing on the engageable surfaces a monolayer of a long-chain aliphatic halogenated polar compound, such as perfluoroalkyl acid. An effective method of passivation is to enclose a source of passivation, such as a predetermined quantity of time-released passivant material, in a closed cavity with the micromirrors at time of device manufacture.

Conventional hermetic packaging of MEMS devices usually involves a packaging process that departs from the processes normally used for non-MEMS device packaging. MEMS hermetic packaging is expensive not only because the package often includes a ceramic material, or a metallic or glass lid, but also because the package must be configured to avoid contact with moving and other sensitive parts of the MEMS device and to further allow a controlled or reduced atmosphere inside the package. The high package cost is, however, in conflict with market requirements for many applications of MEMS devices, which put a premium at low device cost and, therefore, low package cost. Further, the conventional fabrication of hermetic MEMS packages also encounters many technical challenges, such as those caused by potentially high temperatures in connection with welding of a hermetic lid to the package base. As an example, a recently proposed package with a sealing process using a glass core involves temperatures considerably above 450° C., typically between 525 and 625° C. dependent on the sealing glass selected. These temperature ranges are a risk for the reliability of silicon integrated circuits and for proper functioning of many MEMS device components.

It would be advantageous to have a more fully hermetically packaged MEMS device which could target low cost industrial, automotive and consumer applications not currently reached by higher cost packaged devices.

It would be advantageous to have a more fully hermetically sealed MEMS device fabrication process in which both the front-end process flow as well as the packaging process flow would take advantage of semiconductor batch processing techniques applied in the fabrication of non-MEMS integrated circuit devices.

In would be advantageous to have a more fully hermetically sealed MEMS device including appropriate passivating and lubricating agents, or controlled gaseous pressure in internal cavities, and wherein final sealing process steps could be effected within temperature limits established in non-MEMS integrated circuit device package manufacturing, such as wire bonding and solder reflow temperatures.

SUMMARY

The above-mentioned issues and objectives are addressed by structures and processes disclosed herein for hermetically sealed microelectromechanical systems (MEMS) devices and their manufacture.

In an example embodiment, a semiconductor chip has a surface on which are formed both integrated circuit (IC) and MEMS device components. The MEMS device components are formed within a cavity which is hermetically sealed by a cap. At least one via-hole extends from a position on the chip surface under the cap to a corresponding position on an opposite chip surface. The via-hole has an insulating sidewall and a metallic filling. This filling includes a peripheral layer of a first metal adhering to the sidewalls and a central body adhering to the peripheral layer. The first metal has a first melting temperature and the central body includes intermetallic compounds of the first metal with a second metal which has a second melting temperature lower than the first melting temperature. The metallic filling closes the via-hole hermetically and, consequently, the whole MEMS package is hermetic.

In a described example, the first metal is gold and the second metal is indium. In another example, the first metal is gold and the second metal is tin. Other examples include the first metal being silver and the second metal being indium; the first metal being copper and the second metal being tin; and the first metal being copper and the second metal being indium.

In another embodiment, the central body includes a core of a third metal, wherein the third metal has a third melting temperature higher than the second melting temperature. Example choices for the third metal include copper and nickel.

Another embodiment provides a wafer-scale method for fabricating hermetic packages for MEMS devices. A layer of a first metal is deposited onto insulating sidewalls of grooves, which have been formed in the MEMS component-carrying surface of chips on a semiconductor wafer. The first metal has a first melting temperature, and the amount of first metal on the sidewalls of each groove has a first weight.

In another process step, an enclosing cavity is formed over each chip by covering the MEMS components and grooves of each chip with a cap of hermetic material. Thereafter, semiconductor material is removed from the wafer surface opposite the MEMS component-carrying surface until the bottom of each groove is opened. By this thinning process, the grooves are transformed into via-holes extending through the wafer. Each via-hole is then filled with a metallic body, which includes a second metal with a second melting temperature lower than the first melting temperature, and in an amount having a second weight. This second weight may be selected so that the second metal can, in a later step, be fully consumed into intermetallic compounds with the first metal. With thermal energy optionally applied, the second metal is then melted. A portion of the first metal is dissolved into the liquid second metal until the second metal is fully consumed into intermetallic compounds with the first metal. For filling via-holes with larger diameters, a metallic body is used which includes a core of a third metal wrapped by layers of the second metal. The core may resemble the contours of the via-hole, and the third metal has a third melting temperature higher than the second melting temperature.

In a described example, the first metal is gold and the second metal is indium; the first weight is at least about 46% and the second weight is not more than about 54% of the sum of the first and second weights. In another example, the first metal is gold and the second metal is indium; the first weight is about 63% and the second weight about 37% of the sum of the first and second weights.

The described method allows the via-holes of each chip to be used, prior to filling, as portals for introducing cleaning agents into each cavity, and further to deposit compounds into the cleaned cavity for stabilizing, lubricating and protecting the hermetically sealed MEMS components.

An example wafer-scale fabrication flow for producing more fully hermetic MEMS packages with distributed lubricants and controlled atmospheres in the cavities utilizes a methodology to metallize auxiliary via-holes early in the process flow as a binary system so that at the end of the process flow the via-holes can be closed by intermetallic compounds formed at low temperatures. These intermetallics can be formed at the melting temperature of a low-melting metal of the binary system, while any reflow of the intermetallics would require a much higher melting temperature. Binary metals are selected which interact to form intermetallics with reflow temperatures much higher than typical solder reflow temperatures needed for assembling the MEMS device onto circuit boards.

BRIEF DESCRIPTION OF THE DRAWINGS

Example embodiments are described with reference to the accompanying drawings, wherein:

FIGS. 3A-5C illustrate steps in an example method of fabrication of a hermetically packaged MEMS device.

FIG. 3A is a cross-sectional view of a semiconductor wafer with a plurality of grooves at die regions on a wafer surface.

FIG. 4 is a cross-sectional view of the wafer portion of FIG. 3A to summarize the process steps of forming the MEMS, after formation of a cap member over the wafer.

FIGS. 5A-5C are cross-sectional views illustrating alternative steps for sealing open via-holes after thinning the wafer.

DETAILED DESCRIPTION OF EXAMPLE EMBODIMENTS

Figure 1A:
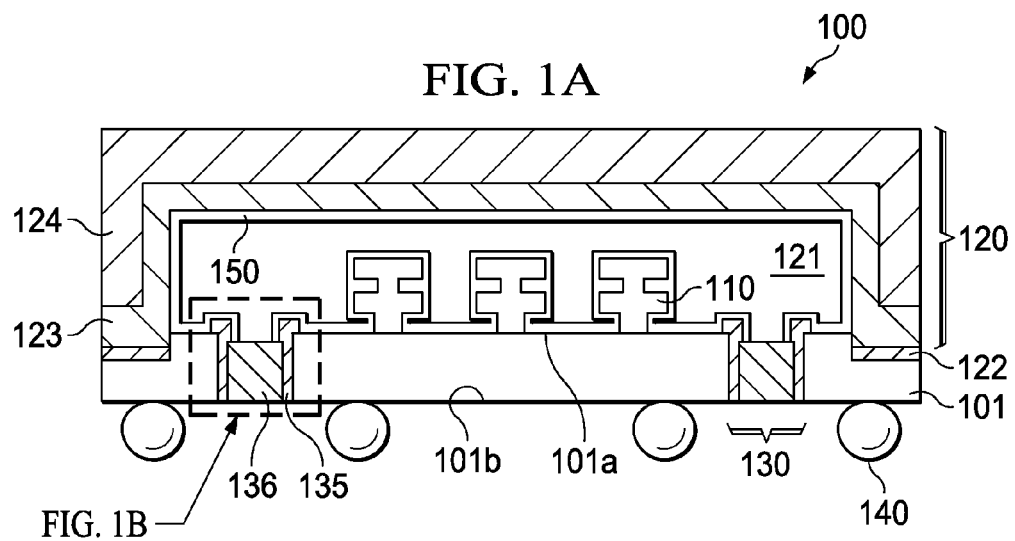
FIG. 1A is a cross-sectional view of an example hermetically packaged microelectromechanical systems (MEMS) device illustrating principles of the invention.
Figure 1B:
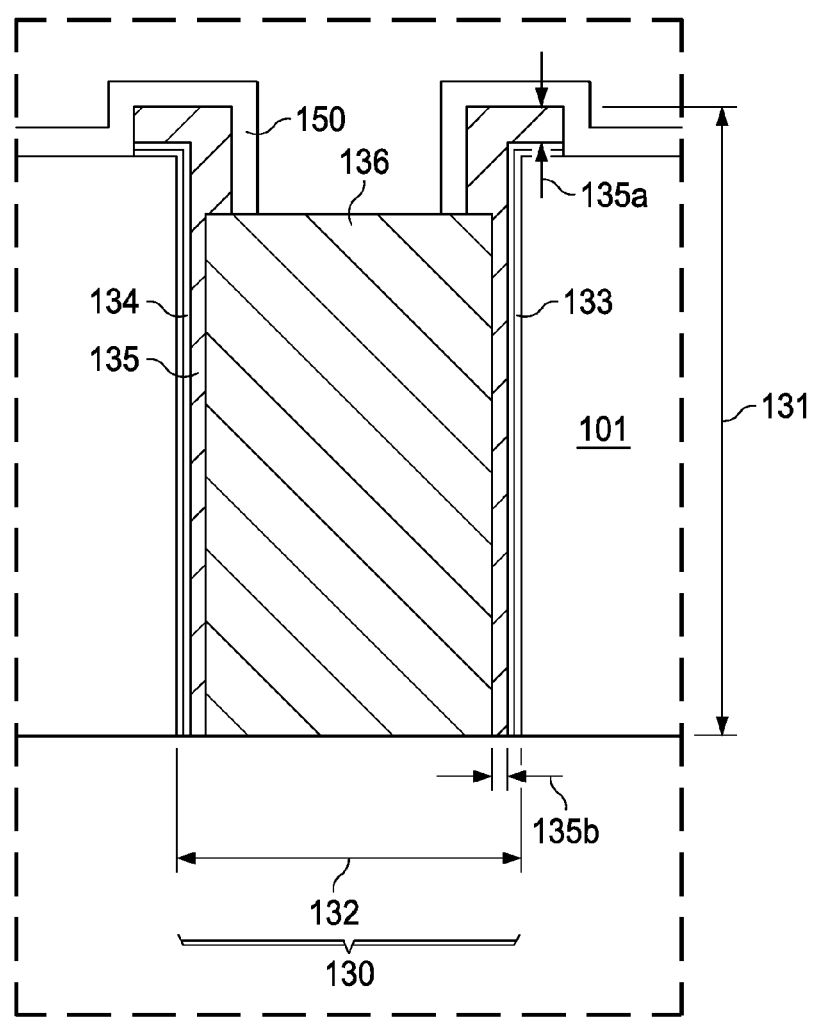
FIG. 1B is an enlarged view of a via-hole portion of the embodiment of FIG. 1A.

FIGS. 1A and 1B illustrate an example hermetically packaged microelectromechanical systems (MEMS) device 100 having via-holes through a chip substrate, wherein the via-holes have metallic fillings including intermetallic compounds with a remelting temperature higher than solder attachment temperatures.

The example hermetic MEMS device 100 includes a chip substrate 101 of a semiconductor material such as silicon, silicon germanium, or gallium arsenide. Device 100 has one or more MEMS components 110 fabricated on an upper surface 101a of chip 101 together with associated circuit components of an integrated circuit (IC). A cap 120, which is impermeable to water molecules and thus hermetic, is attached to the chip surface 101a at peripheral regions 122 prepared for enabling hermetic seals. The cap 120 is configured with a raised central portion and depending sides so that it provides a cavity 121 over chip surface 101 within which the MEMS components 110 can be enclosed. Cap 120 may, for example, have a top metal protection layer 124 of plated nickel, or copper, on an underside of which is formed an adhesion layer 123 which may be a plated copper layer deposited on a plated titanium-copper seed layer. The cap 120 may optionally be formed with a radiation transparent window in order to, for example, allow incident and reflected visible or non-visible light or other radiation to pass to and from the MEMS components 110. Regions 122 may be recesses formed marginally of the chip surface 101a configured to sealingly engage with complementary bottom edges of the depending sides of cap 120. Regions 122 may be coated with an about 3 μm thick layer of copper-doped aluminum or indium on a 0.1 μm seed layer, or other material suitable for sealing to form a hermetic bond with the metal of layer 123 of cap 120.

Device 100 has one or more via-holes 130 extending through chip substrate 101 from the upper surface 101a to an opposite chip lower surface 101b. By way of example, FIG. 1B shows two via holes 130. The top of each via-hole 130 opens into the enclosed cavity 121 which is protected above and on the sides by hermetic cap 124 with lower edges sealed peripherally at regions 122 of surface 101a. The bottom of each via-hole opens onto the external lower surface 101b of the chip 101. The via-holes 130 are hermetically sealed between their top and bottom openings by a metallic compound formed within the via-hole. In FIG. 1A, example device 100 is shown belonging to the class of ball grid array (BGA) packages with solder balls 140 arrayed on the surface 101b for electrically connecting components of the integrated circuit externally. In other embodiments, external connections may be established using bonding wires or other external connections such as those used with non-MEMS devices. Internal connections from on-board circuit components at surface 101a to the solder ball, bonding wire or other external connection contact points may be by through-substrate vias (TSVs), metal interconnects or other suitable circuit connections.

The MEMS components 110 may include actuators, motors, sensors, light modulators (e.g., movable micromirrors), and/or other microelectomechanical elements. The cavity 121, defined by the lower contour of cap 120 and the upper surface 101a of chip substrate 101, provides a hermetic enclosure for MEMS components 110. The cavity 121 is sized to enable movable elements of the MEMS components to move unobstructed by walls of the cavity. Bottom edges of sides of cap 120 are sealed peripherally at regions 122 to upper surface 101a. Openings of via-holes 130 are sealed with metallic fillings including intermetallic compounds. As FIG. 1A depicts, cavity 121 is empty and cleaned of any residue of prior fabrication steps. Furthermore, as shown in FIG. 1A, surfaces facing cavity 121, including some or all surfaces of the MEMS components 110, may be covered by a film 150 of a chemical compound capable of stabilizing, lubricating and protecting the MEMS components.

FIG. 1B illustrates an example metal-filled via-hole 130 in more detail. For many MEMS device implementations, a height 131 of the via-hole 130 may be about 120 μm and a width 132 may be about 30 to 75 μm. The illustrated via-hole 130 has a layer of dielectric material 133 formed over its sidewalls. Layer 133 provides insulation between metallic materials sealing the via and the surrounding semiconductor material of substrate 101. Layer 133 may also improve bonding between the semiconductor material and subsequent via filling materials. As an example, layer 133 may be an oxide material, such as silicon dioxide, formed over the semiconductor via sidewalls to a thickness of about 0.2 μm. In some implementations, layer 133 may also be a nitride material, such as silicon nitride, or some combination of nitride and oxide materials. Layer 133 may optionally be formed including phosphorus or other additive to impede dissociated water molecule migration. Thereafter, a second layer 134 of material with good adhesion and/or barrier characteristics and having a relatively high melting temperature (viz., compared to temperatures utilized in typical solder reflow, wire bonding or similar die attachment processes) may be formed over the first layer 132. The material may have a melting temperature of >400° C., >900° C., or, more preferably, >1000° C. The second layer 134 may, for example, be a layer of refractory metal selected from the group including titanium, tantalum, tantalum nitride, tungsten, and/or compounds and/or mixtures thereof, formed to a thickness of about 0.2 μm. The remainder of the via-hole is then sealed with a metallic filling.

The metallic filling may include a peripheral annular layer 135 of a first metal which adheres to the adhesion/barrier layer 134 and peripherally lines the sides of the central portion of the via-hole 130. The first metal may be a metal having a high melting temperature compared to temperatures utilized in typical solder reflow, wire bonding or similar die attachment processes. The first metal may have a melting temperature of >400° C., >900° C., or, more preferably, >1000° C. For example, the first metal may be a metal selected from the group including gold, silver, copper, platinum, palladium, nickel, and alloys thereof, having a relatively high melting temperature. A preferred choice for the first metal is copper, which has a melting temperature of about 1084° C. A more preferred choice is gold, which has a melting temperature of about 1064° C.

The remainder of the metallic filling may comprise a core layer 136 of a relatively low melting temperature second metal (viz., on the order of, or less than, temperatures utilized in typical solder reflow, wire bonding or similar die attachment processes) which has interacted with previously deposited amounts of the first metal material of layer 135 to form one or more intermetallic compounds. (Such intermetallic compounds—also called "IMCs" or "intermetallics"—are ordered chemical compounds formed as new phases at certain ratios of two or more metals that have definite crystal lattice structures and properties different from those of the constituent metals.) The second metal preferably has a melting temperature which is considerably lower than the melting temperature of the first metal. The second metal may have a melting temperature <260° C., or, more preferably, <200° C. The second metal may, for example, be a metal selected from a group including indium, tin, gallium, and alloys thereof. A preferred choice for the second metal is tin, which has a melting temperature of about 232° C. A more preferred choice is indium, which has a melting temperature of about 156° C. In some cases, all of the first metal of annular layer 135 on some or all of the sidewalls of via-hole 130 will be used up in the formation of the intermetallic compounds.

As shown in FIG. 1B, the insulating layer 133, adhesion/barrier layer 134 and remainder of annular first metal layer 135 may extend upward and laterally outward from the upper opening of the via-hole 130 beyond the upper level of the metallic filling material of core layer 136. This extension may be covered with the film 150, as shown. The first metal annular lining layer 135 may have an initial thickness 135a of about 3 to 5 μm which is retained in regions of non-interaction to form intermetallic compounds with the second metal of core layer 136 (see regions of layer 135 above the upper level of core layer 136 in FIG. 1B). In regions where the first and second metals have formed intermetallic compounds (e.g., regions below the upper level of core layer 136 in FIG. 1B) the deposited first metal has been largely dissolved into the intermetallic compounds leaving only a thinned down layer of first metal 135 with a reduced thickness 135b of about 0.5 μm or less. A characteristic of the formation of the intermetallic compounds is such, and the relative dimensions of the first and second metal layers are so chosen, that the intermetallic compound crystals will be found throughout the metallic filling formed by the deposited layers 135, 136, and not merely at the interface where they formed.

Although the formation of the intermetallic compounds may occur at low temperatures, the formed intermetallic compounds themselves will have a much higher melting temperature. Since remelting of the intermetallic compounds will then only take place at the higher temperatures, the intermetallic compounds will not melt in the lower temperature ranges (typically, less than 260° C.) required in later processes for solder reflow to attach device 100 to an underlying platform. With the formation of the metallic filling by deposition of the core layer 136 over the annular layer 135, the opening of via-hole 130 is closed hermetically. No portion of the intermetallic metallic filling will remelt when solder balls 140 are reflowed, or when bonding wires are attached to device 100, since the melting temperatures of the intermetallics are higher than those needed for solder reflow or wire bonding.

Figure 2A:
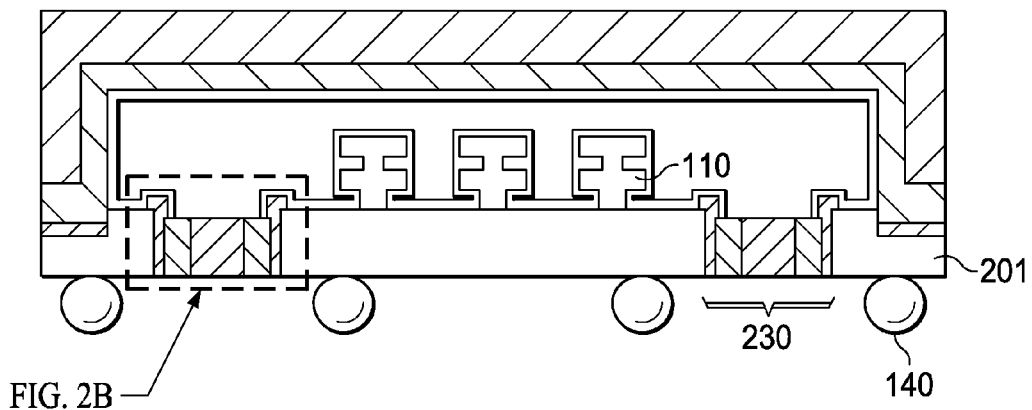
FIGS. 2A and 2B are views, corresponding to those of FIGS. 1A and 1B, of a modified form of the hermetically packaged MEMS device of FIGS. 1A and 1B.
Figure 2B:
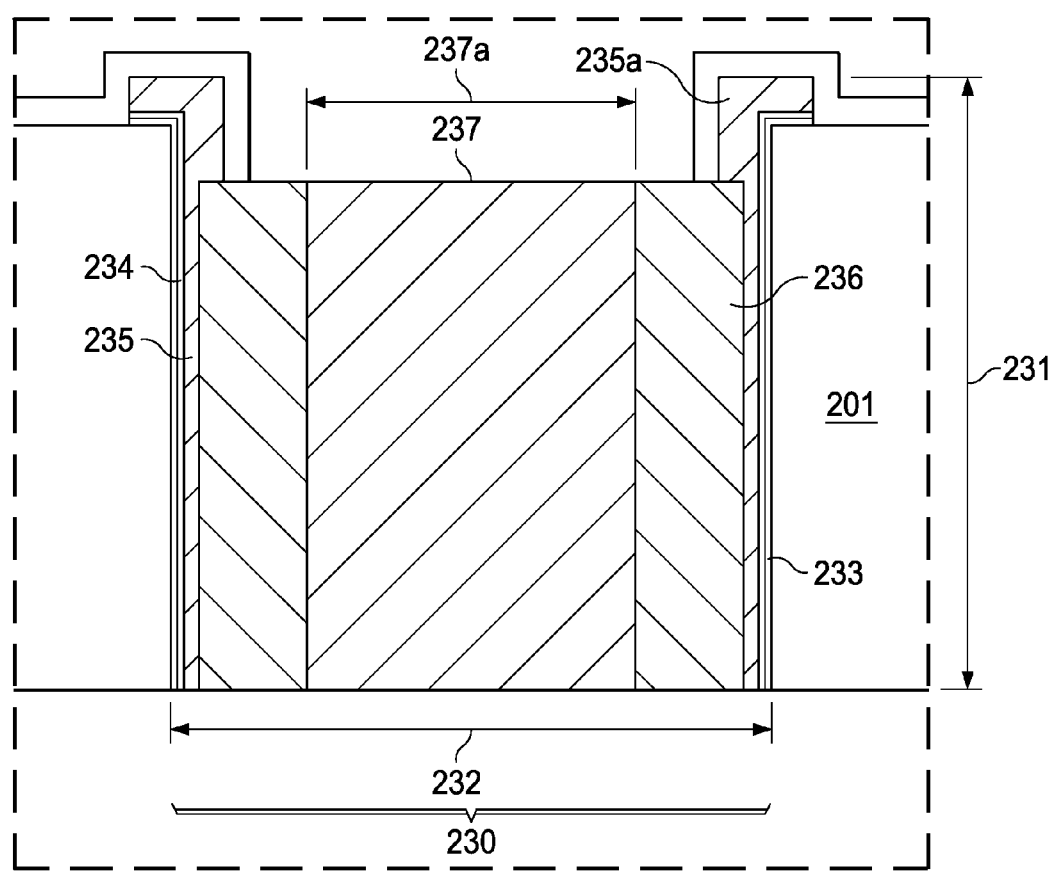

FIGS. 2A and 2B illustrate a modified form 200 of the hermetically sealed packaged MEMS device 100 of FIGS. 1A and 1B. Device 200 is similar to the device 100 except for the configuration of the metal filled via-holes 230 which are formed through the semiconductor chip 201. Like the via-holes 130 of device 100, via-holes 230 may have a height 231 of about 120 μm. The width of via-hole 230 is, however, wider with an example preferred width 232 of about 50 to 150 μm. Moreover, the metal filling of the via-holes includes an additional layer centrally of the first and second intermetallic compound-forming layers, as further described below.

As shown in FIG. 2B, via-hole 230 has sidewalls formed by one or more layers of insulating material, which provide electrical insulation between the metallic filling and the surrounding semiconductor material. As an example, a layer 233 of, e.g., 0.2 μm thickness of semiconductor oxide (such as silicon dioxide) and/or semiconductor nitride (such as silicon nitride) may be formed in contact with the semiconductor walls of the via-hole opening. A barrier layer 234 of, e.g., 0.2 μm thickness of titanium or tantalum nitride may be formed over and in contact with the oxide layer 233. The remainder of the via-hole 230 is then sealed with a metallic filling.

The metallic filling may include remaining portions of a deposited outer annular first layer 235 of a relatively high melting temperature first metal, which adheres to the underlying sidewall layers 233, 234. In places 235a where the first metal has not formed intermetallic compounds with a second metal, the first metal may have a thickness of about 3 to 5 μm. In places where the first metal has formed intermetallic compounds with a subsequently deposited second metal, only a thin version of the deposited original layer of first metal of, for example, less than about 0.5 μm thickness may remain adhering to the sidewall over layer 234. As with the first metal of device 100, the first metal of device 200 may have a melting temperature of >400° C., >900° C., or, more preferably, >1000° C., and may be selected from a group including gold, silver, copper, platinum, palladium, nickel, and alloys thereof, with one preferred choice being copper, and another being gold.

The metallic filling further includes a second layer 236 comprised of a relatively low melting temperature second metal that has interacted with the first metal similar to the interaction of second metal of core layer 136 with the first metal of annular layer 135 in device 100 of FIGS. 1A and 1B. However, unlike the core layer 136, the second layer 236 fills only an intermediate annular portion of the via-hole 230 and not the entire remaining core portions. The second metal of intermediate annular layer 236 has a melting temperature less the first metal melting temperature, and interacts to form intermetallic compounds with the first metal of the outer annular layer 235. The second metal of device 200 may have a melting temperature of <260° C., or, more preferably, <200° C., and may be selected from a group including indium, tin, gallium and alloys thereof. A preferred choice for the second metal may be tin or indium. Similar to the intermetallic compounds formed in device 100, the intermetallic compounds formed between the first and second metals in device 200 have a melting temperature higher than the second metal melting temperature and may extend throughout the annular metallic filling region. And, as before, because remelting of the intermetallic compounds would only take place at much higher temperatures, the intermetallic compounds will not melt in the temperature range required for solder-attaching device 200 to an external part.

In addition to the remaining portion, if any, of outer annular layer 235 and to the intermediate annular layer 236, the metallic filling of via-hole 230 illustrated in FIGS. 2A and 2B includes an inner core layer 237 comprising a third metal and surrounded by the intermetallic compound intermediate layer 236. The third metal may be selected from a group including copper, nickel, zinc, cobalt, and alloys thereof. It has a melting temperature higher (for example, >400° C., >900° C., or, preferably, >1000° C.) than the second metal melting temperature so that it will not melt when the second metal is liquefied to form intermetallics with the dissolving first metal. The width 237a of inner core layer 237 can be selected in dependence on the width 232 of via-hole 230. With the formation of the metallic filling with inner core layer 237, intermediate intermetallic compound layer 236, and any remnant of outer layer 235, via-hole 230 is hermetically sealed. The melting temperatures can be chosen so that none of the metallic filling will remelt when solder balls 140 are reflowed, or when bonding wires are attached to device 200. As with the device 100, the intermetallic compounds formed in device 200 have melting temperatures (for example, >400° C., >500° C., or, more preferably, >600° C.) that are higher than the typical solder reflow or wire bonding temperatures.

FIGS. 3A-5C illustrate steps in an example wafer-scale method for fabricating the described hermetically packaged MEMS devices.

Figure 3A:
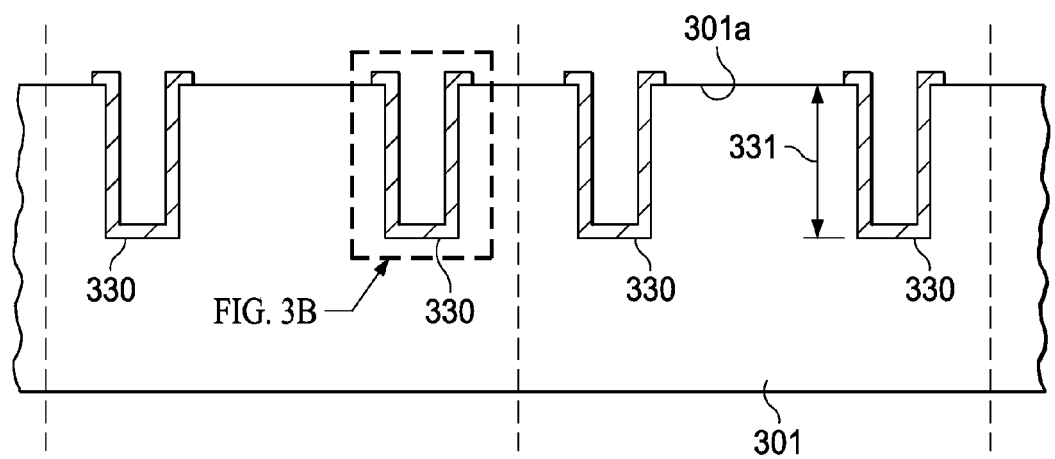

FIG. 3A shows a portion of a wafer substrate 301 having a plurality of chip or die regions for forming a corresponding plurality of MEMS devices. The regions are indicated by portions of wafer 301 shown between vertical dashed lines, which correspond roughly to cutting lines used for later singulation. The wafer may be a typical commercially available silicon or other semiconductor material wafer having a thickness of about 200 and 350 μm and which has a surface on or in which are formed both integrated circuit (IC) and microelectromechanical components for a MEMS device.

Figure 3B:
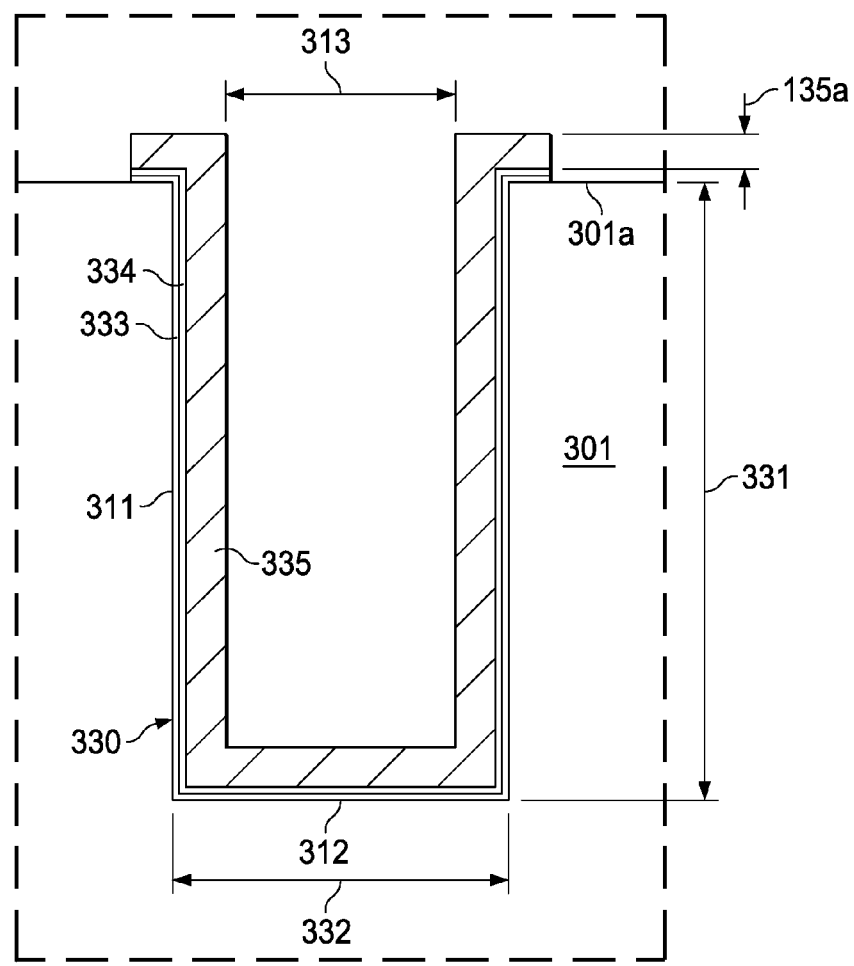
FIG. 3B is an enlarged view of a portion of the wafer of FIG. 3A.

As shown in FIGS. 3A and 3B, at least one groove or recess 330 is formed into a top surface 301a of wafer 301 at each die region. Two grooves 330 per die region are illustrated. The grooves may be formed at any suitable point in the process of fabricating the circuit and/or microelectromechanical components, and preferably use resources and steps already otherwise present in the fabrication process.

In one example implementation, the surface 301a of wafer 301 is selectively etched through a patterned mask at a suitable point in the MEMS device fabrication process to form a plurality of closed bottom via-hole grooves 330 to a depth 331 less than the full thickness of the wafer. The grooves 330 may advantageously be formed using steps that simultaneously pattern and etch other features of the device. The illustrated wafer 301 is shown selectively etched with an anisotropic etchant to form generally circular cross-sectional cylindrical closed bottom grooves 330 having more or less vertical sidewalls 311 with depth 331 and width 332. Depending on preferences and processing steps used for their formation, the grooves may of course have other configurations (sloped sidewalls, elongated non-symmetrical dimensioning, rectangular/hexagonal cross sections, etc.) compatible with the crystalline structure and orientation of the wafer material. Internal dimensioning of grooves 330 may depend on the number, thickness and constituency of insulating, barrier and metal layers to be formed within the grooves. For formation of devices like devices 100, 200 described with reference to FIGS. 1A, 1B, 2A and 2B, the configurations, depths and widths of grooves 330 are formed to match the configurations, depths and widths of via-holes 130, 230.

Following formation of the closed bottom hole grooves 330, one or more layers of dielectric material, such as silicon dioxide and/or silicon nitride discussed for layers 133, 233 above, are formed on the sidewalls 311 to create a thin (<<1 μm thickness) insulating layer 333 between the semiconductor material of substrate 301 and later conductive layers formed inside the groove. Next, one or more layers of material with good adhesion and/or barrier characteristics, such as the materials discussed for layers 134, 234 above, are deposited to form a thin (<<1 μm thickness) adhesion/barrier layer 334 over the insulating layer 333. The material of layer 334 may optionally be chosen to function as a seed layer with respect to subsequently deposited metal layers.

After formation of the dielectric and adhesion/barrier layers 333, 334, one or more layers of metallic material are deposited over the adhesion/barrier layer to form a relatively high melting temperature first metal layer 335, corresponding to the layers 135, 235 previously described. The first metal layer 335 is formed peripherally on the sidewalls 311 to a thickness 335a, partially filling the interior of the groove hole 330 annularly and leaving a core opening of width 313 remaining (The relative thicknesses of the first metal layer material and subsequently deposited core filling materials are chosen in consideration of the intermetallic compounds that will be formed.) For formation of devices such as the previously described devices 100, 200, the layer 335 may be formed to a thickness 335a of, for example, about 3 to 5 μm corresponding to the thickness 135a, 235a discussed in connection with FIGS. 1A and 1B and FIGS. 2A and 2B, above. Other applications may form layer 335 to a greater or lesser thickness 335a. Layer 335 is preferably formed with a uniform thickness over sidewalls 311. In order to provide good adhesion and increase the surface area for subsequent formation of intermetallic compounds at the interface with subsequently deposited second metal material, layer 335 is preferably also formed to have a rough exposed internal surface at the open core of groove 330.

In the embodiment illustrated in FIGS. 3A and 3B, the first metal layer 335 is formed prior to thinning the wafer 301 to open the closed bottom of via-hole groove 330 to provide a through-hole via. Alternatively, however, the first metal layer 335 may be formed after opening the bottom of the via-hole. Moreover, one or more layers of layers 333, 334 may also optionally be formed after opening the bottom of groove 330. (It is also possible to form a through-hole via directly without first forming a closed bottom via-hole groove.)

The first metal 335 may be a high melting temperature metal selected from the previously mentioned group including gold, silver, copper, platinum, palladium, nickel, and alloys thereof, with preferred choices being copper or gold both of which have melting temperatures above 1000° C.

Figure 4:
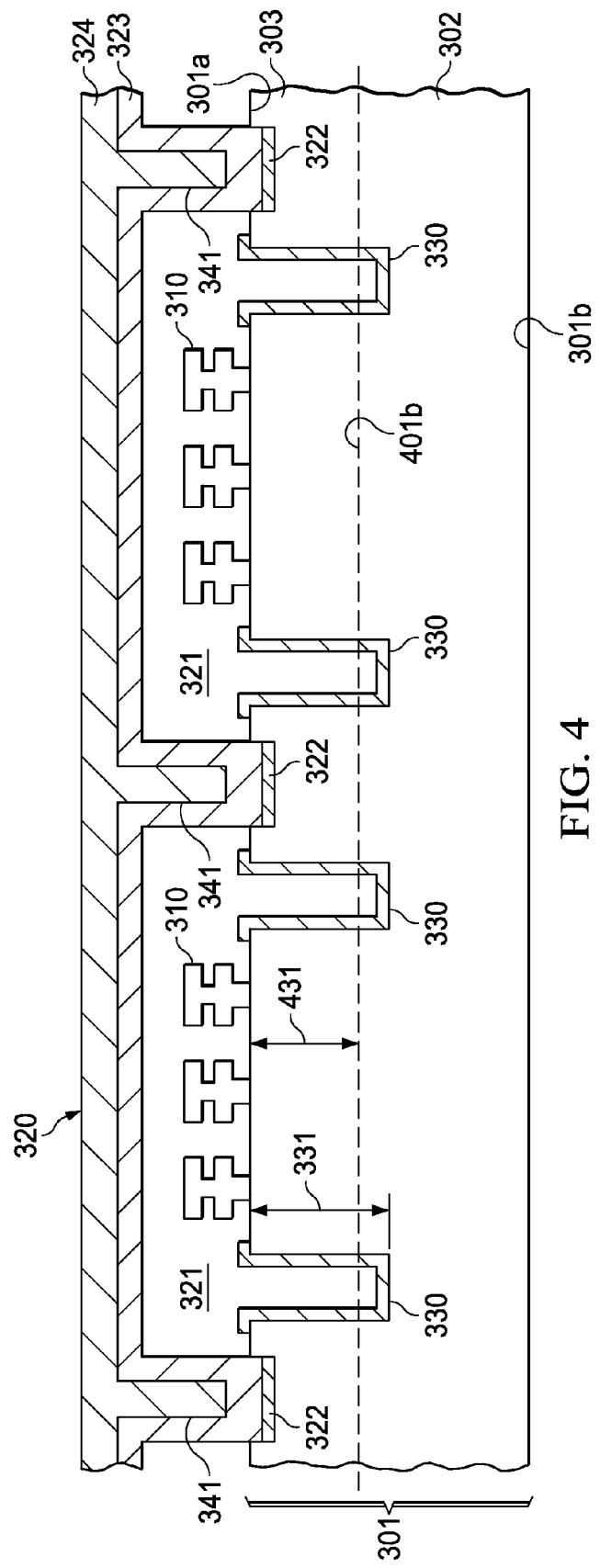

FIG. 4 illustrates wafer 301 with grooves 330 after formation of circuit and microelectromechanical components 310 on or in the upper surface 301a and after attachment of a hermetic cap member 320 to surface 301a peripherally of each die region. The circuit and micromechanical components 310 may be formed using techniques applicable to the formation of the similar components of non-hermetic packaged devices. The cap member 320 is a water impermeable structure that seals to the upper surface 301a and defines a cavity 321 over each die region for enclosing the respective microelectromechanical components 310. Cap member 320 is preferably a preformed or in situ fabricated wafer-size structure that initially spans a plurality of die regions, and that is later singulated together with the die regions to provide respective discrete ones of the MEMS devices. Alternatively, cap member 320 could be provided as separate individual preformed or in situ fabricated cap elements which are respectively attached over individual ones of the die regions.

For the example illustrated in FIG. 4, the cap member 320 may span multiple die regions and include a lower metal layer 323 suitable for bonding to the surface 301a and an upper metal layer 324 suitable for providing external protection. The member 320 may, for example, comprise a preformed structure having a substrate including the upper metal layer 324 formed with downwardly facing recesses between depending portions 341. The lower metal layer 323 may be formed conformally over the underside of the upper metal layer 324. The bottoms of the depending portions 341 may be fit within complementary recessed regions or trenches 322 formed in surface 301a, marginally of each die region, with the downwardly facing recesses defining the cavities 321. Regions 322 may be coated with a material suitable for hermetically bonding the lower metal 323 at the bottom ends of portions 341 within the marginal trenches 322. Alternatively, regions 322 may be left unrecessed and the bottoms of depending portions 341 may be bonded to portions of surface 301a at which the substrate material has been metalized (for example, silicided regions of a silicon substrate material).

In one form, the upper metal layer 324 may be nickel and the lower metal layer 323 may be copper. In another form, the upper metal layer 324 may be a layer of plated nickel or copper and the lower metal layer 323 may be a plated copper layer deposited on a plated titanium-copper seed layer. The cap member 320 may optionally include radiation transparent windows respectively located over the die regions of substrate 301 in order to, for example, allow incident and reflected visible or non-visible light to pass to and from the MEMS components 310 (e.g., where the components 310 include elements such as movable reflecting elements of a digital micromirror device (DMD)). In one form, regions 322 may, for example, be coated with an about 3 μm thick layer of copper-doped aluminum or indium on a 0.1 μm seed layer.

In another fabrication example, suitable for some but not all MEMS devices, the cap member 320 may be formed in situ over the substrate 301. In such example, one or more layers of photoresist or other sacrificial material may be formed over the surface 301a and patterned to a configuration defining the volumes of the spaces which will become the cavities 321. (The sacrificial material may be one or more additional layers formed over the components 310 or, in some cases, may include one or more layers already used in prior processing steps.) One or more layers of material may then be deposited over the patterned sacrificial material to form the lower layer 323, and one or more other layers of material may then be deposited over the lower metal layer 323 to form the upper layer 324. The sacrificial material can then be removed (e.g., by selective wet etching) through the via-holes after the bottoms of grooves 330 have been opened and before the cores of the via-holes have been sealed (viz. with the first and second metal intermetallics), as discussed further below. An example of such approach is described below with reference to FIGS. 10A-10E.

As shown in FIG. 4, the bottoms of grooves 330 of the illustrated embodiment are still closed when the cap member 320 is attached, and the thickness of the semiconductor wafer 301 remains relatively unchanged (except for the addition of layers added to provide the circuit and microelectromechanical components 310). The cap member 320 has a size commensurate with the size of the wafer, and the components 310 of each die region are located within a cavity space 321 defined between the bottom of a downwardly opening recess of cap member 320 and substrate 301. The tops of the closed bottom grooves 330 are open to the respective cavity spaces 321.

Figure 5A:
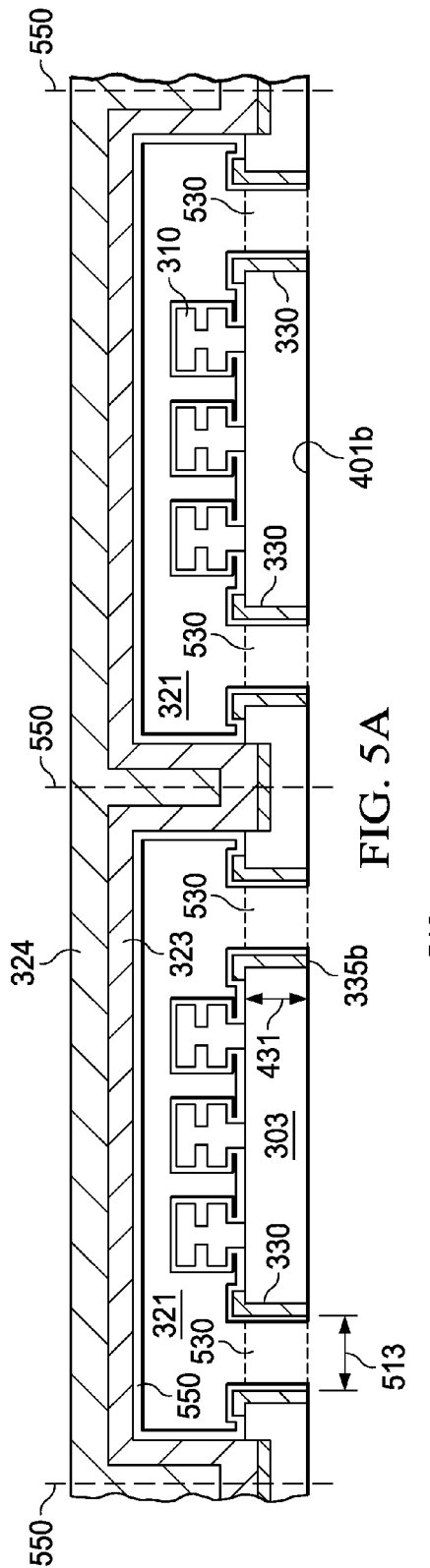

Next, the bottoms of grooves 330 are opened. This may be done by thinning the wafer, such as through backgrinding, etching, or both. The thinning process removes semiconductor material from a back surface 301b of wafer 301 until a new back surface 401b (shown by dashed lines in FIG. 4) and a new wafer thickness 431 less than the depth of the closed bottom grooves 330 is provided. This opens the bottoms of the grooves 330, thereby establishing top and bottom open-ended via-holes 530 extending through the thinned wafer thickness 431, as shown in FIG. 5A. The thinning removes a lower portion 302 (FIG. 4) of the wafer, leaving an upper portion 303 of thickness 431 remaining In some embodiments, the remaining portion thickness 431 may be about 70 to 150 μm. Other thicknesses are also possible.

Once the open through-hole vias 530 have been established, external access is provided from and to the internal cavity spaces 321 that enclose components 310. The open via-holes 530 can be used for cleaning, removing any unwanted materials remaining, and introducing new materials. For example, cleaning agents (e.g., chemical solvents, gases, or plasmas) can be applied through via-holes 530 to remove residual photoresist or other sacrificial materials left from forming or temporarily supporting/immobilizing components 310 in prior processing steps. In some implementations, photoresist or sacrificial material remaining in the cavity spaces 321 can be used as a mask prior to its removal, to enable deposition of one or more of the layers 333, 334, 335 on the sidewalls after thinning, with the residual material acting to prevent the layer material from entering the cavities 321. The via-holes 530 can also be used to introduce getters, lubricants, protectants and other materials for stabilizing, passivating, lubricating and protecting components 301. As an example, FIG. 5A shows a film 550 deposited through the via-holes 530 onto internal surfaces of cavities 321 at each die region, including over exposed surfaces of components 110.

After cleaning the cavities 321 and depositing getter, lubricant and other materials, as appropriate, the via-holes 530 are hermetically closed by applying one or more layers of metal, such as previously described layers 136, 236, 237, over the first metal layer 335. An insulating layer may be deposited on the newly created surface 401b, for example by using a polyimide compound, followed by patterned metal connections, which may, for instance, be made of eutectic gold-germanium alloy (12.5 weight % Ge, eutectic temperature 361° C.) and provide electrical contacts to the now exposed end points 335b (FIG. 5A) of first metal layer 335.

Figure 5B:
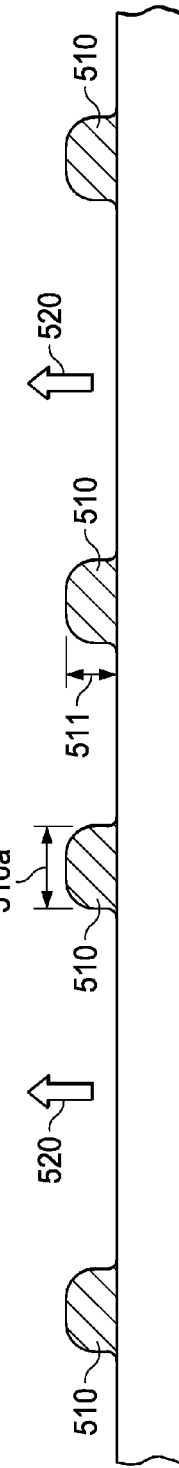
Figure 5C:
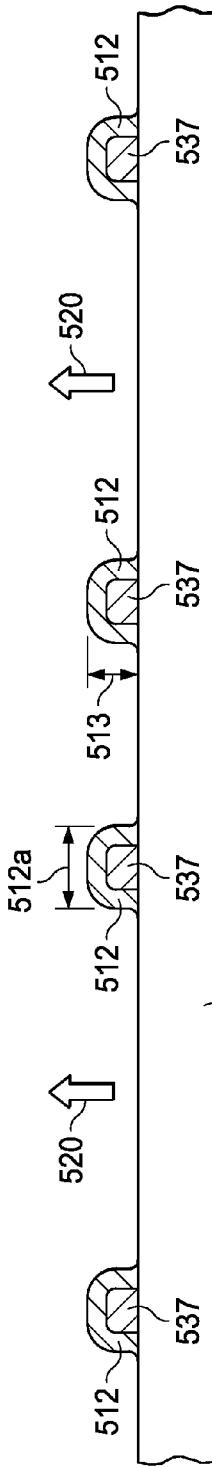

FIGS. 5B and 5C illustrate example methods for filling the via-holes 530 with metallic bodies. In these methods, a carrier 501 is provided, which may be made of a recyclable material such as a metallic sheet, or a sacrificial material such as a plastic film. Carrier 501 is preferably sized to match the size of the semiconductor wafer 301.

The method depicted in FIG. 5B is useable to provide a metal filling such as described previously in connection with FIGS. 1A and 1B. Metallic bodies 510 of a second metal are prepared in positions on carrier 501 matching the locations of via-holes 530. The second metal has a relatively low melting temperature that is considerably lower than the melting temperature of the first metal. The second metal may be selected from the group including indium, tin, gallium, and alloys thereof. The second metal is provided in an amount with a weight selected relative to the weight of the prior deposited first metal, so that the second metal can be fully consumed into intermetallic compounds with the first metal. FIG. 5B depicts an amount of second metal formed as a heap, mound or pile 510 of granulated or powdered metal with a heap diameter 510a somewhat greater than the inner width 513 of the openings of the via-holes 530 with the previously deposited first metal layer 335 covering the sidewalls 311. The height 511 may be selected dependent on the volume of the via-hole 430 opening to be filled, the selection of the first and second metals, and the diameter 510a of the heap 510. In some embodiments, the height 511 of the heap may be in the range of about 70 to 100 μm.

FIG. 5C depicts a modified method useable for filling via-holes 530 having larger widths 513 such as those described previously in connection with FIGS. 2A and 2B. Here, metallic bodies are prepared in laterally spaced positions on an upper surface of carrier 501 that match the locations of via-holes 530, and which include a core 537 of a third metal wrapped by one or more layers 512 of the second metal. The core 537 is generally contoured to complement the corresponding contour of the respective opening 513. The third metal has a third melting temperature higher than the second melting temperature, so that the core 537 will not melt when the layers of the second metal are liquefied. The third metal may be selected from the group including copper, nickel, zinc, cobalt, and alloys thereof. The second metal 512 is provided in an amount with a weight selected relative to the weight of the prior deposited first metal, so that the second metal can be fully consumed into intermetallic compounds with the first metal. FIG. 5C depicts the configuration of second metal wrapping the core of the third metal as a layer with a diameter 512a suitable to fit within the inner width 513 of the wider openings of the via-holes 530 with the previously deposited first metal layer 335 covering the sidewalls 311. One method of creating the layers of second metal is by electroplating with a mask. The height 513 of the heap 512/537 may be chosen dependent on the volume of the via-hole 530 opening to be filled, the selection of the first and second metals, and the diameter 512a of the heap. In some embodiments, the height 513 of the heap 512/537 may be in the range of about 70 to 100 μm.

With the metallic heaps in place, the carrier 501 of FIG. 5B or 5C is moved in the direction indicated by arrows 520 to bring the top of carrier 501 into contact alignment with the bottom 401b of substrate portion to insert the metallic heaps 510 or 512/537 into the bottoms of respective ones of the corresponding via-holes 530. After inserting the heaps into the via-hole bottom openings 513, thermal energy is applied to liquefy the second metal by raising its temperature above its relatively low melting point temperature. The relative melting points are such that the thermal energy may be applied without raising the first (and, if applicable, third) metal above its relatively higher melting temperature. After liquefying the second metal, while the temperature is kept somewhat above the second metal melting temperature, first metal atoms diffuse into the liquefied second metal to form intermetallic compounds with the second metal, until at least a portion of the first metal is dissolved. The temperature may thereafter be lowered below the second metal melting temperature, preferably while a residual portion of the first metal layer 335 remains on the via sidewalls. The intermetallic compound formation process may continue until the weight of the second metal is fully consumed into intermetallic compounds with the first metal.

In a preferred process, at least a major portion of the first metal 335 is dissolved into intermetallic compounds with the second metal 510, 512, so that at most only a relatively thin layer of first metal 335 remains over the via-hole sidewalls 311. In some implementations, especially where the intermetallic compounds adhere well to the underlying adhesion/barrier layer 334 (e.g., of refractory metal), the process may be implemented so that the entire amount of the deposited first metal 335 is consumed in the formation of the intermetallic compounds. In some implementations, the intermetallic compounds can be formed at room temperature or through application of thermal energy without raising the temperature of the second metal above its relatively low melting point temperature.

Following the intermetallic compound formation, the via-holes 530 are fully sealed with a hermetic plug having a central body of intermetallic compounds extending across the entire opening 513 such as illustrated by the layer 136 in FIG. 1B, or with a hermetic plug having a central core of a third relatively higher melting temperature metal surrounded by an annular or ventral body of intermetallic compounds such as illustrated by the layers 236, 237 in FIG. 1B.

At an appropriate time after the heaps have been introduced into the openings 513, the carrier 501 is separated from the thinned substrate portion 303. This may typically be done following liquefying the second metal, at or after the time the temperature is lowered (viz., to ambient)—the carrier serving to hold the liquefied second metal in place until it is secured through formation of the intermetallic compounds. Carrier 501 may be re-used or discarded.

While still in wafer form, processing steps may be performed to provide connections of the encapsulated devices to external parts. For example, solder balls 140 may be attached to the chips as shown in FIGS. 1A and 2A. (If preferred, the connections may be provided following singulation.)

Thereafter, the wafer may be singulated, such as by cutting along the singulation lines 550 shown in FIG. 5A, to separate the die regions into discrete hermetically packaged MEMS device chips. The singulated devices can be electrically connected by solder ball remelting, wire bonding or other techniques through contacts formed during fabrication of the circuit components.

The melting temperature for liquefying the second metal is low enough so as to not interfere with thermal budget restrictions of later steps in device fabrication. The melting temperatures of the first (and, if applicable, third or additional) metal and of the formed intermetallic compounds are high enough so as to keep the via-hole hermetic sealing in tact during any subsequent last fabrication steps and solder ball, wire bond or other applications of heat to make external connections for the device.

FIGS. 6 to 9 show solid/liquid phase diagrams of binary metal systems for example first and second metals, with the second metal having a melting temperature <260° C., or, more preferably, <200° C.; the first metal having a melting temperature of >400° C., >900° C., or, more preferably, >1000° C.; and the formed intermetallics having a melting temperature of >400° C., >500° C., or, more preferably, >600° C. The abscissa plots the percent of the second metal (weight percent and atomic percent, respectively) and the ordinate plots the temperature in ° C. In the solid regime, the diagrams further list some intermetallic compounds and their remelt temperatures. Such diagrams may be used in selecting the weight of the first metal (the first weight) and the weight of the second metal (the second weight) for intermetallic compounds, both metal weights expressed as percentage of the sum of the first and the second weights.

Figure 6:
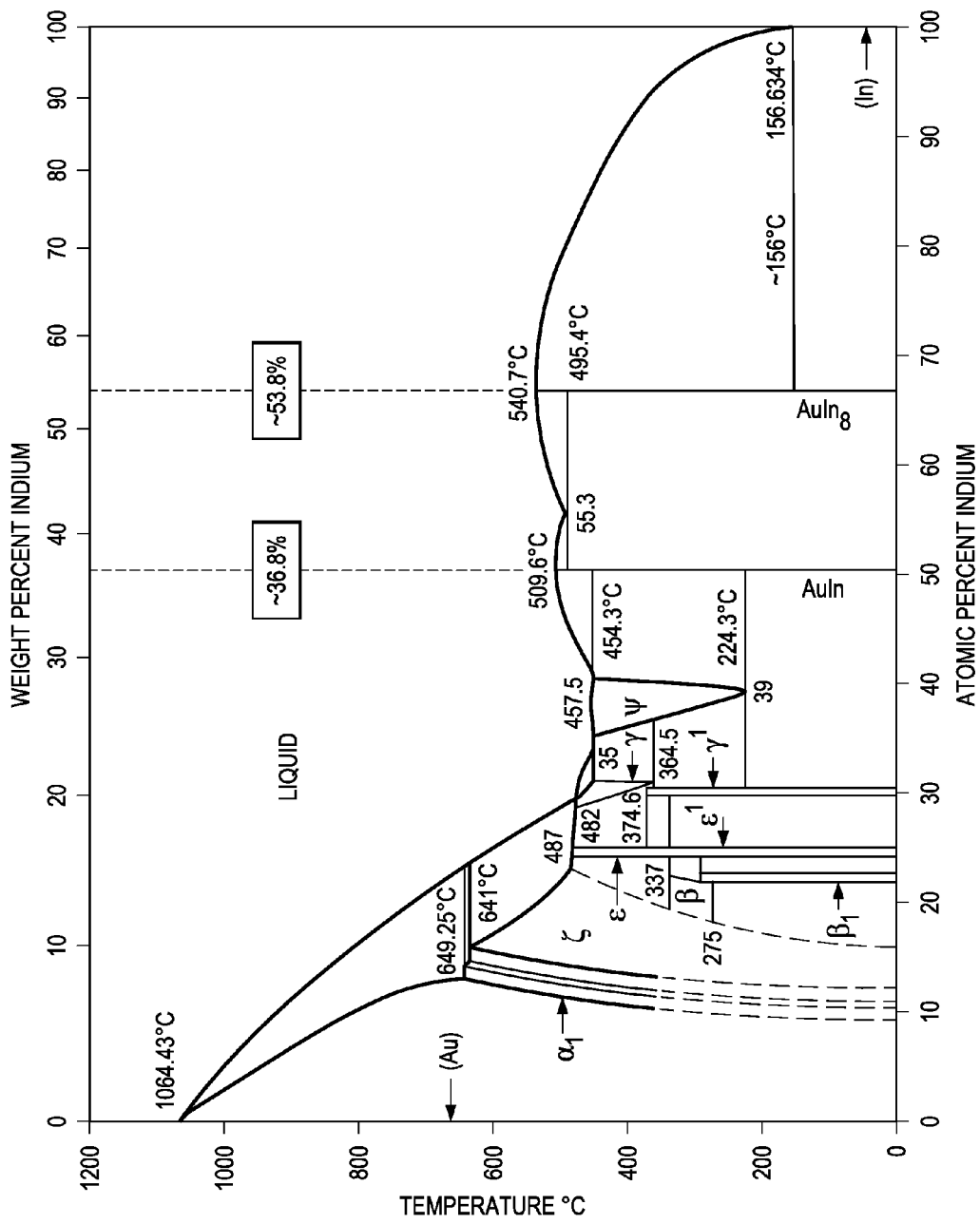
FIGS. 6 to 9 respectively illustrate gold-indium, copper-indium, gold-tin and copper-tin binary metal phase diagrams as can be found in "Binary Alloy Phase Diagrams," editors T. B. Massalski and H. Okamoto, published by ASM International.

FIG. 6 depicts a solid/liquid phase diagram for a binary gold-indium metal system, with gold being the first metal and the abscissa plotting the percent indium (weight percent and atomic percent, respectively) as the second metal. As FIG. 6 indicates, the second metal (In) melts at about 156° C., after which temperature the first metal (Au, with melting temperature about 1064° C.) is dissolved into the liquid indium, primarily forming the intermetallic compound $AuIn_8$, and, with additional gold dissolved, the intermetallic compound InAu. $AuIn_8$ remelts at about 540° C., and AuIn at about 510° C. Based on the diagram of FIG. 6, a preferred application involves the first weight (Au) with at least about 46% and the second weight (In) with not more than about 54% of the sum of the first and second weights (Au+In). Another example application involves the first weight (Au) with about 63% and the second weight (In) about 37% of the sum of the first and second weights.

Figure 7:
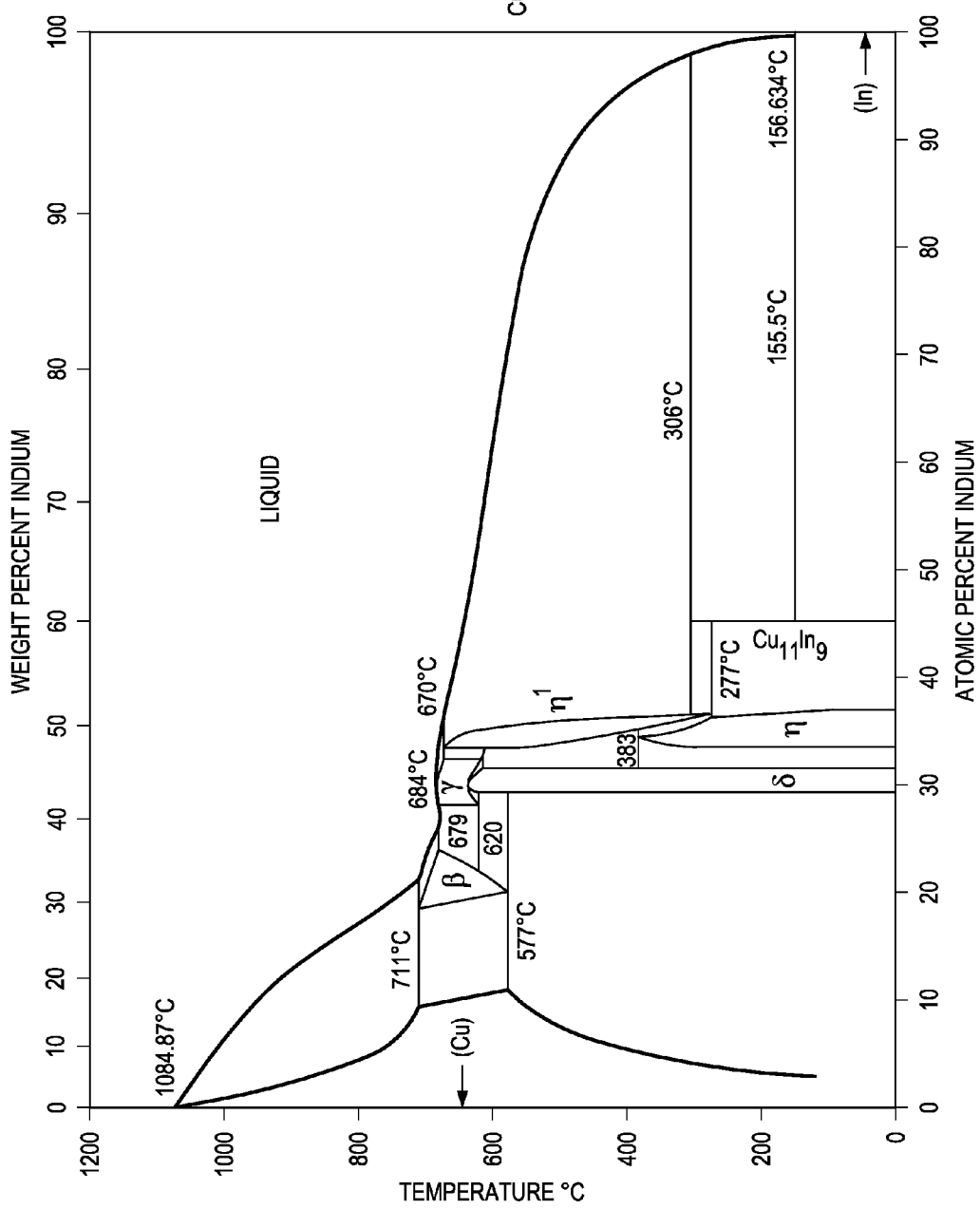

FIG. 7 depicts a solid/liquid phase diagram of a binary copper-indium metal system, with copper being the first metal and the abscissa plotting the percent indium (weight percent and atomic percent, respectively) as the second metal. The use of copper as the first metal is advantageous because it enables a lower cost of fabrication than gold. Using copper as the first metal, after the second metal (In) melts at about 156° C., the first metal (Cu, with melting temperature about 108° C.) is dissolved into the liquid first metal (In), forming the intermetallic compound $Cu_{11}In_9$ and then more copper-rich intermetallic compounds. Preferred applications are in the range of approximately 50 weight % of each of the first metal and the second metal, with temperatures for remelting intermetallic compounds between about 684 and 670° C.

Figure 8:
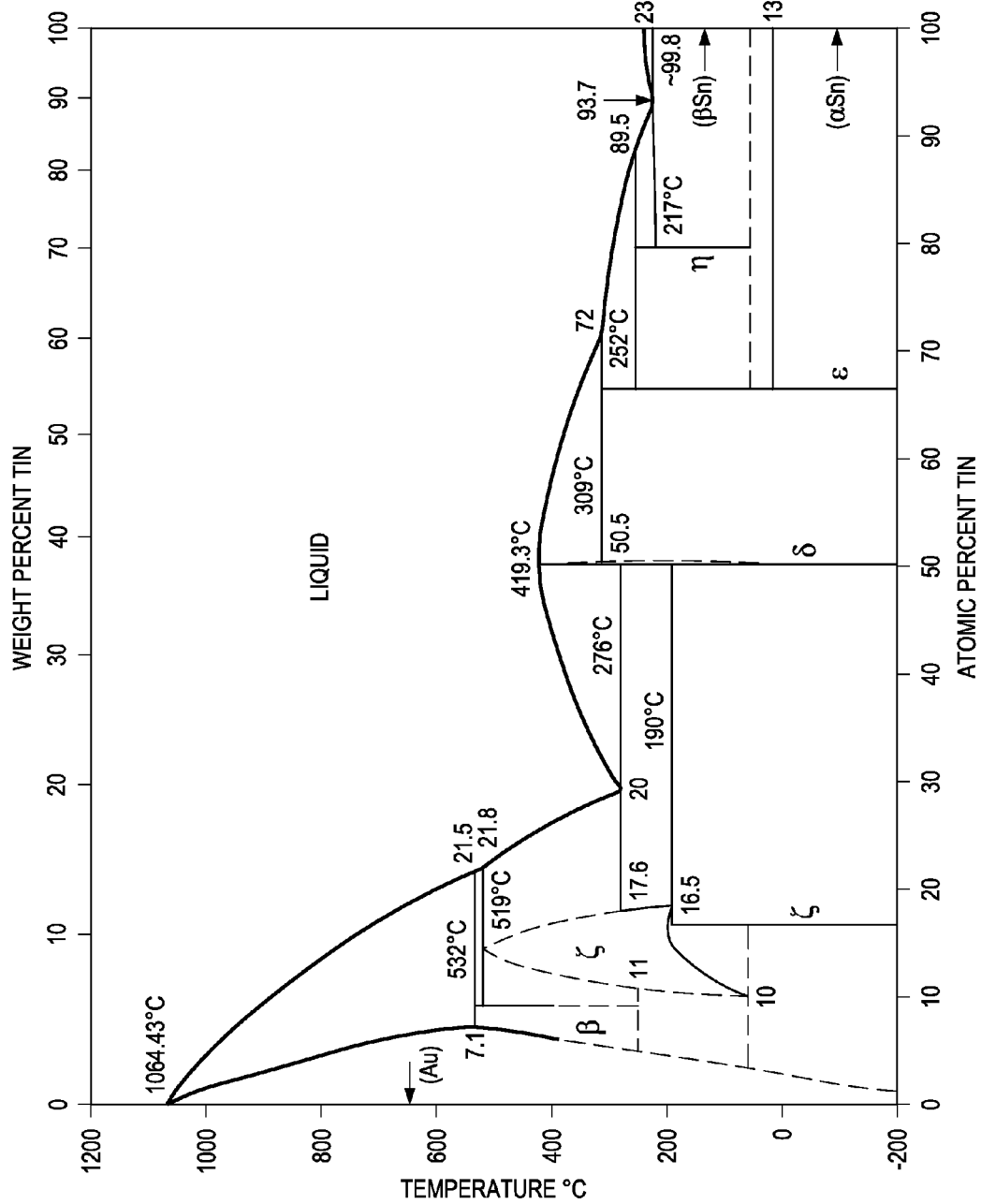

FIG. 8 depicts the solid/liquid phase diagram of a binary gold-tin metal system, with gold being the first metal and the abscissa plotting the percent tin (weight percent and atomic percent, respectively) as the second metal. As FIG. 8 indicates, the second metal (Sn) melts at about 232° C., after which temperature the first metal (Au, with melting temperature about 1064° C.) is dissolved into the liquid tin, forming intermetallic compounds. A gold-rich intermetallic compound of about 62 weight % Au remelts at about 419° C. Consequently, based on the diagram of FIG. 8, a preferred application involves the first weight (Au) of about 62% and the second weight (Sn) of about 38% of the sum of the first and second weights (Au+Sn).

Figure 9:
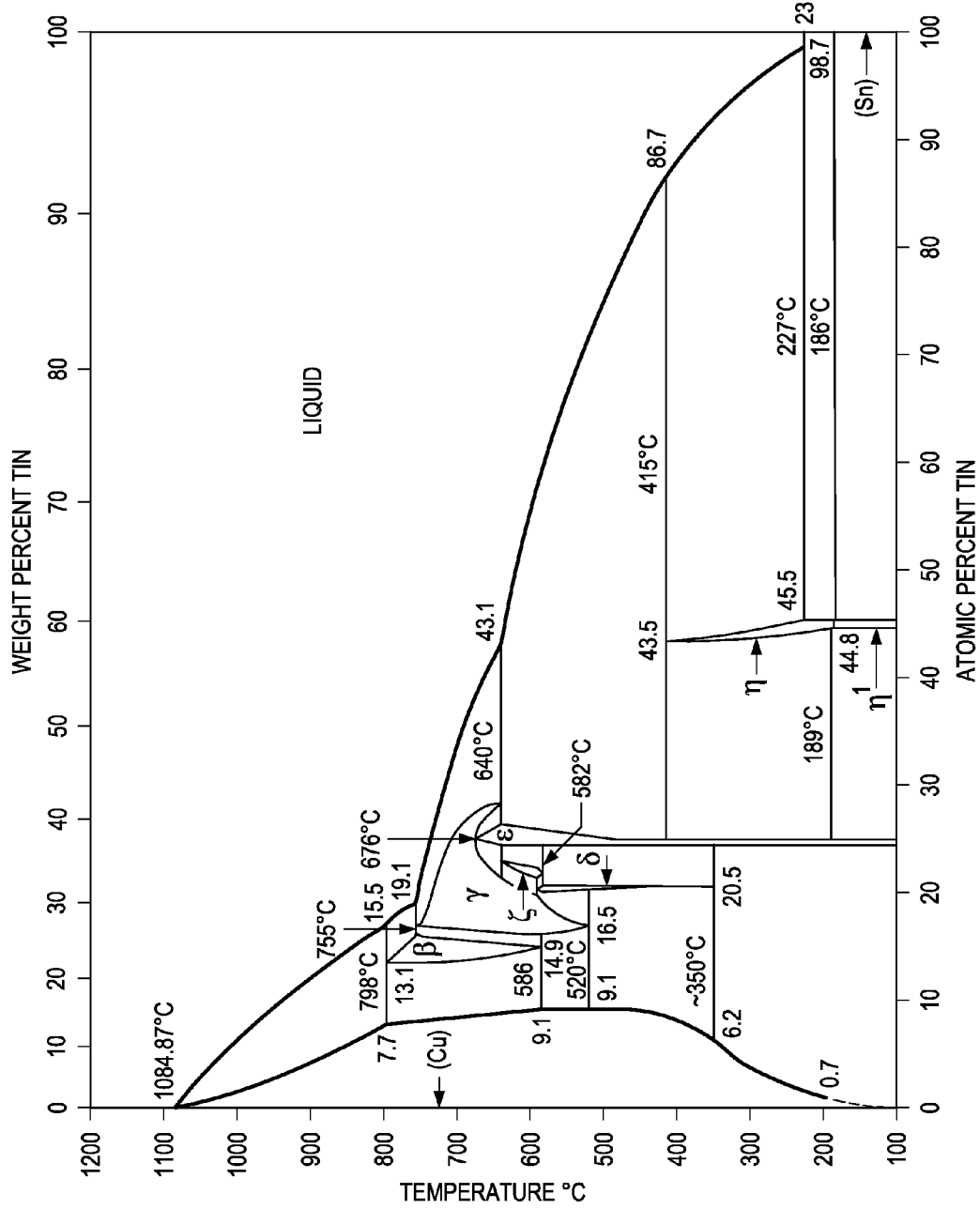

FIG. 9 depicts the solid/liquid phase diagram of a binary copper-tin metal system, with copper being the first metal and tin being the second metal. Copper has advantages from the standpoint of low cost fabrication. The plot shows that after the second metal (Sn) melts at about 232° C., the first metal (Cu, with melting temperature about 1085° C.) is dissolved into the liquid tin and forms intermetallic compounds. Preferred applications are in the range of approximately 58 weight % tin and 42 weight % copper, expressed relative to the sum of the first and the second metal. The temperature for remelting of the intermetallic compound is approximately 640° C.

Another suitable binary metal system has silver as the first metal and indium as the second metal. A phase diagram for this system indicates that after the second metal (In) melts at about 156° C., the first metal (Ag, with melting temperature about 962° C.) is dissolved into the liquid indium and forms intermetallic compounds such as $AgIn_2$. Preferred applications are in the range of approximately 68 weight % silver and 38 weight % indium, expressed relative to the sum of the first and the second metal. The temperature for remelting of the intermetallic compounds is approximately 660° C.

FIGS. 10A-10E illustrate application of the described principles in the fabrication of an example hermetically packaged MEMS device with components 310 in the form of micromirrors, such as the mirrors of a Texas Instruments DLP™ micromirror array device. The illustrated process forms the cap member 320 in situ, although a pre-formed or partially pre-formed cap member 320 could also be used, if preferred. The illustrated process also forms one or more layers lining the sidewalls of through-holes 550 after formation of the cap member 320, although this may add complexity to the process over forming those layers (viz., first metal layer 335) earlier in the fabrication process, which is preferred. (It is noted with respect to the discussed mask layers, that all or part of a prior mask layer may optionally be incorporated within the formation of all or part of a later mask layer, and that a particular mask layer may optionally comprise one or more layers of similar or dissimilar materials.)

Figure 10A:
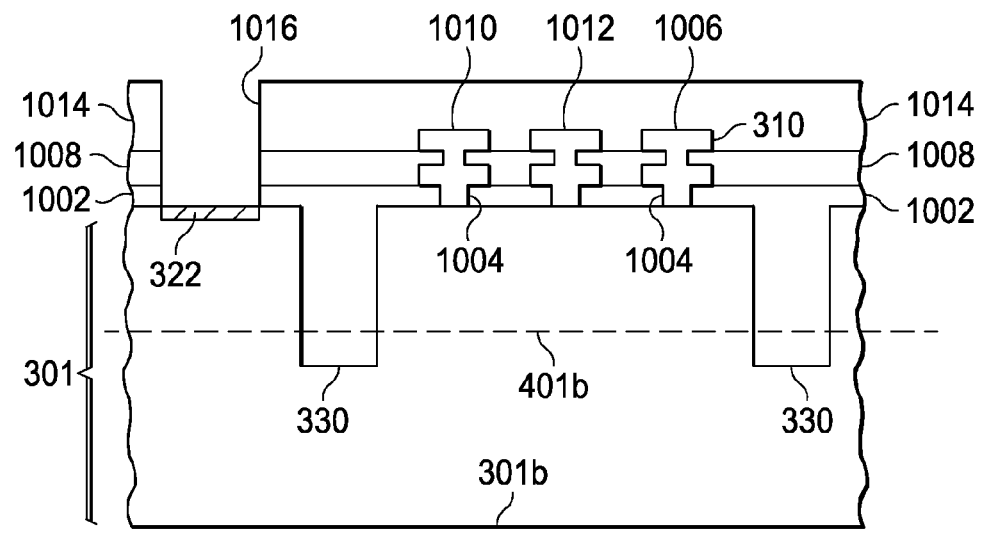
FIGS. 10A-10E are cross-sectional views illustrating application of principles of the invention in fabrication of an example MEMS device with components in the form of movable micromirrors.

As shown in FIG. 10A, closed bottom via-hole grooves 330 are formed into the top surface of wafer 301 at each die region. This may be done after one or more steps for the formation of circuitry (e.g., associated memory cell) below the mirrors of the array. In one approach, mirror-associated circuitry is first formed on or in the top surface of wafer 310 using CMOS fabrication processes; a mask layer of photoresist is formed over the top surface including over the circuitry; the mask layer is patterned with openings at the groove locations; the wafer is etched through the patterned mask layer to form the grooves; and the mask layer is removed. Then, a second mask layer (the first sacrificial layer 1002 shown in FIGS. 10A-10E) is formed over the wafer, including over the groove openings, and the second mask layer is optionally planarized and is patterned with openings at locations for hinge support posts 1004. A layer of hinge material (viz., one or more metal layers) is then blanket deposited over the patterned second mask layer, including within the hinge support openings, and is patterned to form the hinges 1006. The second mask layer (first sacrificial layer 1002) is left in place to support and protect the MEMS components in later steps. (The first metal layer 335 and one or more adhesion/barrier and insulation layers 333, 334 may be formed prior to depositing the second mask, or, with appropriate choice of materials, simultaneously with the deposition of the hinge material through groove location patterns including in the patterned second mask. For purposes of illustration, however, FIGS. 10A-10E show the case where at least the first metal layer 335 is formed after wafer backgrinding.)

Next, a third mask layer (the second sacrificial layer 1008) is formed over the wafer, including over the patterned hinges 1006 and over the remaining first sacrificial layer 1002. The third mask layer is optionally planarized and is patterned with openings at locations for mirror support posts 1010. A layer of mirror material (viz., one or more metal layers) is then blanket deposited over the patterned third mask layer, including within the mirror support openings, and is patterned to form the mirrors 1012. The third mask layer (second sacrificial layer 1008) is left in place to support and protect the MEMS components in later steps.

With the first and second sacrificial layers 1002, 1008 still in place, a fourth mask layer 1014 is formed over the wafer, including over the patterned mirrors 1012. The fourth mask layer 1014 is optionally planarized and is patterned with locations for openings 1016 at locations where the in situ fabricated cap member 320 will join the substrate. The patterned fourth mask layer 1014 may serve as an etch mask for extending the openings 1016 also down through the remaining first and second sacrificial layers 1002, 1008 to the top surface of wafer 310 as shown in FIG. 10A. To provide improved contact between wafer 310 and the cap member 320, suitable landing sites 322 (e.g., silicided regions formed in earlier steps) can be provided at wafer locations which will be met by bottoms of etched openings 1016. Previously prepared sites may include etch stop material.

Figure 10B:
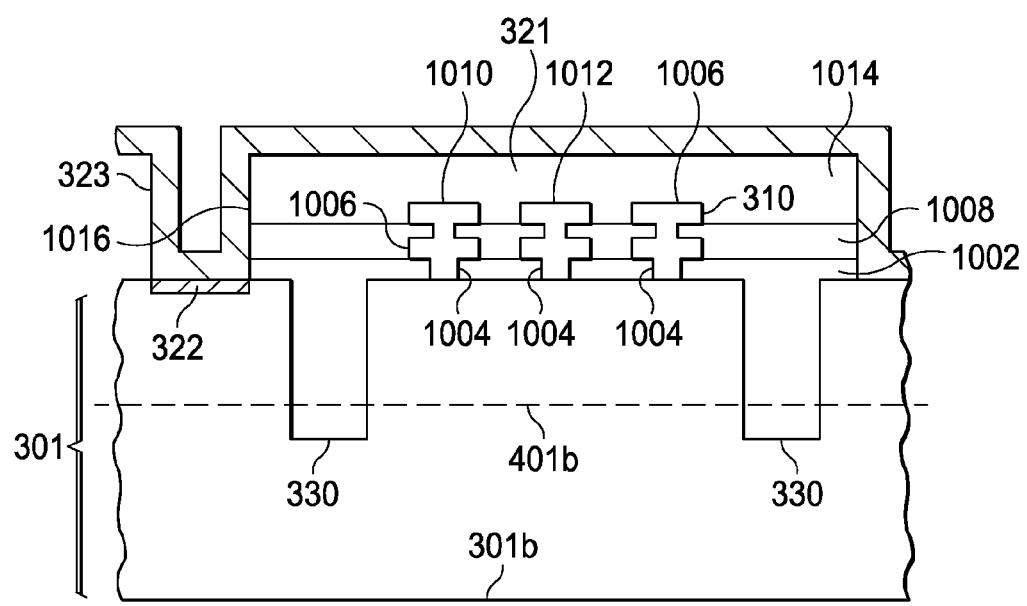
Figure 10C:
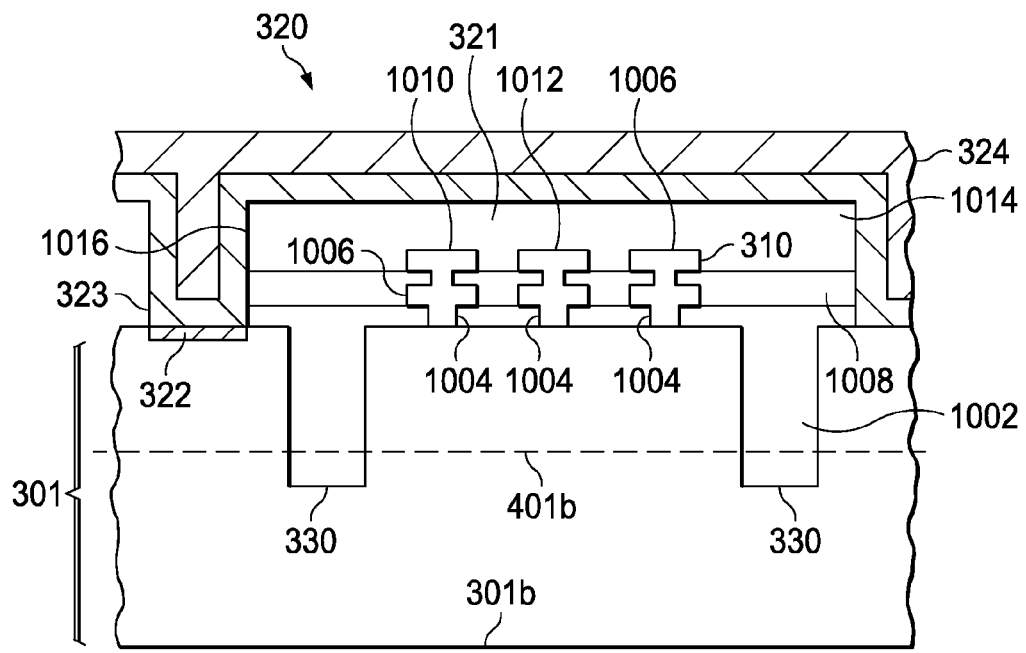
Figure 10D:
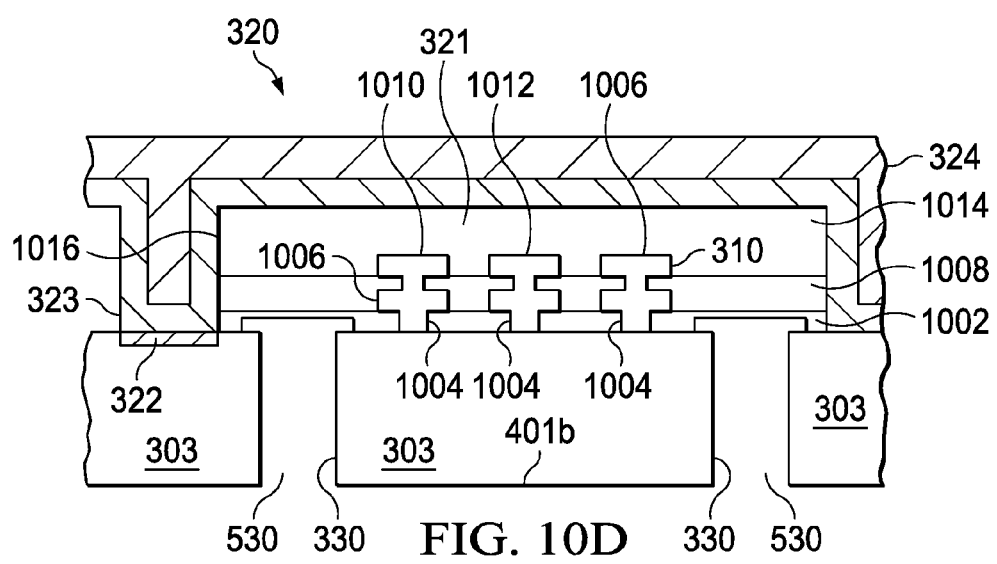

Lower and upper metal layers 323, 324 can then be deposited over the patterned fourth mask layer 1014 to form the cap member 320 in situ. FIG. 10B shows the wafer 301 after forming lower metal layer 323 conformally over the patterned fourth mask layer 1014 including as a first layer lining within the openings 1016. FIG. 10C shows the wafer 301 after subsequent formation of upper metal layer 324 over the lower metal layer 323 including within and filling a rest of the openings 1016. The contour of the top of the patterned fourth mask layer 1014 and the contour of the openings 1016 formed through the fourth mask layer 1014 and the two sacrificial layers 1002, 1008 define the shape of the cavities 321 formed between the bottom surface of the cap member 320 and the top surface of the wafer 301.

Figure 10E:
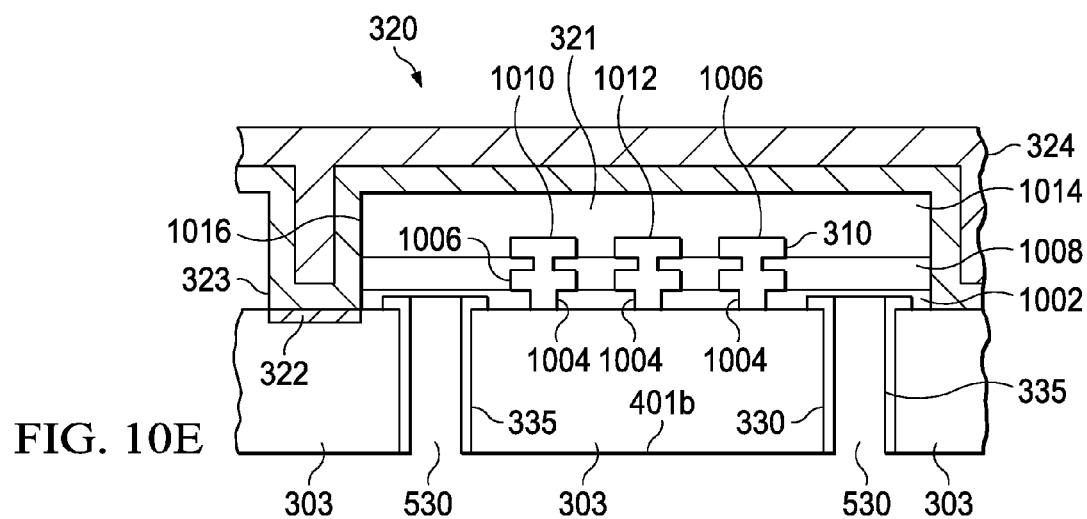

The thickness of the capped wafer shown in FIG. 10C may then be reduced, such as by backgrinding to form a new bottom surface at the location shown by the dashed line. This opens the bottoms of via-hole recesses 330, providing through-holes 530 giving access to the cavities 321 for removal of any remaining masking or sacrificial layer material. For implementations which form the first metal layer 335 at this point in the processing, portions of the layer 1002 filling the via-hole recesses 330 can be etched back the open bottoms to the positions shown in FIG. 10D. A thin layer of first metal material can then be formed on the sidewalls of through-holes 530, including processing to leave open or reopen the top ends of through-holes 530 after first metal deposition. The resulting structure is shown in FIG. 10E. Remaining mask and sacrificial layers 1002, 1008, 1014 are then removed from the cavity (viz. by wet etching) through the passages provided by the open through-holes 530, and the openings are sealed by adding the second metal (or second and third metals) for forming the intermetallics as previously described.

The described principles may be applied to any semiconductor material for chips with via-holes, including silicon, silicon germanium, gallium arsenide, or any other semiconductor or compound material used in manufacturing. The via-holes may be uniform or may be different from each other. The via-holes may be arrayed in an orderly pattern, or randomly located. The via-hole sidewalls may have one or more metal layers of higher melting temperature, prior to adding the lower melting temperature material. The innermost layer may have a smooth surface or a rough surface. The central bulk of the via-hole may be formed by intermetallic compounds of binary metal systems, or by intermetallic compounds of ternary or higher metal systems.

Those skilled in the art will appreciate that modifications may be made to the described embodiments, and also that many other embodiments are possible, within the scope of the claimed invention.

What is claimed is:

1. A method, comprising:
   providing a semiconductor substrate having a surface, a closed bottom groove and microelectromechechanical (MEMS) components formed on the substrate, a layer of a first metal having a melting temperature >400° C. formed over sidewalls of the groove, and a cap attached to the substrate that provides a cavity which encloses the components and the groove;
   opening the closed bottom of the groove, thereby establishing an open through-hole via providing external access through the substrate to the cavity;
   introducing a second metal having a melting temperature <260° C. into the via; and
   interacting the second metal with the first metal to form one or more intermetallic compounds having a melting temperature >400° C. to seal the via.

2. The method of claim 1, further comprising removing material from the cavity through the via before introducing the second metal.

3. The method of claim 2, wherein the removed material includes remnant of sacrificial material used in forming the MEMS components.

4. The method of claim 1, further comprising introducing material into the cavity through the via before introducing the second metal.

5. The method of claim 4, wherein the introduced material includes at least one of a cleaning agent, getter, lubricant, or protectant.

6. The method of claim 1, wherein the substrate is provided also including a layer of dielectric material formed over the sidewalls of the groove; the layer of first metal being formed over the layer of dielectric material.

7. The method of claim 6, wherein the substrate is provided also including a barrier layer
   of material having a melting temperature >400° C. formed over the sidewalls over the layer of dielectric material; the layer of first metal being formed over the barrier layer.

8. The method of claim 7, wherein the material of the barrier layer has a melting temperature >1000° C.

9. The method of claim 1, wherein interacting the second metal with the first metal comprises applying thermal energy to liquefy the second metal without liquefying the first metal.

10. The method of claim 1, wherein the introduced second metal is fully consumed into intermetallic compounds with the first metal.

11. The method of claim 1, wherein the first metal comprises at least one of gold, silver, copper, platinum, palladium, or nickel; and the second metal comprises at least one of indium, tin or gallium.

12. The method of claim 11, wherein the third metal has a melting temperature >1000° C.

13. The method of claim 1, wherein introducing the second metal includes introducing a third metal having a melting temperature >400° C. into the via, as a core material together with the second metal; and interacting the second metal with the first metal includes to forming the one or more intermetallic compounds to provide a metallic filling sealing the via and having a melting temperature >400° C.

14. The method of claim 1, wherein the first metal has a melting temperature >900° C., the second metal has a melting temperature <200° C.; and the one or more intermetallic compounds have melting temperatures of >500° C.

15. The method of claim 1, further comprising reflowing solder balls on the substrate after the via is sealed.

16. The method of claim 1, further comprising, after sealing the vias, separating the die regions by singulating the wafer.

17. A method, comprising:
   providing a semiconductor substrate;
   forming a closed bottom groove in a surface of the substrate;
   forming microelectromechechanical (MEMS) components on the surface;
   forming a layer of a first metal having a melting temperature >400° C. over sidewalls of the groove;
   providing a cap attached to the substrate, the cap being configured with a raised central portion and depending sides that provide a cavity over the surface which encloses the components and into which the groove opens;

opening the closed bottom of the groove, thereby establishing an open through-hole via extending through the substrate to the cavity;

introducing a second metal having a melting temperature <260° C. into the established via; and interacting the second metal with the first metal to form one or more intermetallic compounds to seal the via with a metallic filling having a melting temperature >400° C.

18. The method of claim 17, wherein forming the components includes forming a sacrificial layer; and further comprising removing at least a portion of the sacrificial layer through the via prior to introducing the second metal.

19. The method of claim 18, further comprising forming a layer of dielectric material over the sidewalls; and forming a barrier layer of material having a melting temperature >400° C. over the sidewalls over the layer of dielectric material; the layer of first metal being formed over the barrier layer.

20. The method of claim 19, wherein interacting the second metal with the first metal comprises applying thermal energy to liquefy the second metal without liquefying the first metal.

21. A method, comprising:

providing a wafer having a plurality of die regions;

forming at least one closed bottom groove into a surface of the wafer at each die region;

forming microelectromechechanical (MEMS) components on the surface at each die region;

forming a layer of a first metal having a melting temperature >400° C. on sidewalls of each groove;

providing a water impermeable cap attached to the wafer at each die region, the cap being configured with a raised central portion and depending sides that provide a cavity over the surface which encloses the components and into which the at least one groove opens;

opening the closed bottoms of the grooves, thereby establishing at least one open through-hole via extending through the wafer at each die region, providing access from and to the respective associated cavity;

introducing a quantity of a second metal having a melting temperature <260° C. into the open bottom of the established at least one through-hole via at each die region; and interacting the introduced quantity of the second metal with the first metal to form an intermetallic compound, thereby sealing the through-hole via at each die region with a metallic filling having a melting temperature >400° C.

22. The method of claim 21, wherein forming the components includes forming a sacrificial layer; and further comprising removing at least a portion of the sacrificial layer through the at least one via established at each die region.

23. The method of claim 21, further comprising forming a layer of dielectric material over sidewalls of each groove; the layer of first metal being formed over the layer of dielectric material.

24. The method of claim 23, further comprising forming a barrier layer of material having a melting temperature >400° C. over the sidewalls over the layer of dielectric material; the layer of first metal being formed over the barrier layer.

25. The method of claim 21, wherein providing the cap comprises providing a cap member spanning multiple die regions.

26. The method of claim 25, wherein the cap member includes a metal layer over an adhesion layer.

27. The method of claim 25, wherein the cap member is provided as a preformed structure.

28. The method of claim 25, wherein the cap member is formed in situ on the wafer.

29. The method of claim 21, wherein the bottoms of the grooves are opened by backgrinding the wafer.

30. The method of claim 21, wherein interacting the introduced quantity of the second metal with the first metal layer comprises applying thermal energy to liquefy the second metal without liquefying the first metal.

31. The method of claim 21, wherein introducing the quantity of the second metal comprises providing respective discrete quantities of the second metal at relative positions on a carrier corresponding to relative positions of the respective vias on the wafer; and bringing the carrier into alignment with the wafer to respectively insert the discrete quantities into the vias.

32. The method of claim 31, wherein the wafer comprises silicon; and wherein the cap is attached to silicided regions of the wafer provided peripherally of each die region.

* * * * *